(12) United States Patent
Ting et al.

(10) Patent No.: US 10,515,888 B2
(45) Date of Patent: Dec. 24, 2019

(54) SEMICONDUCTOR DEVICE AND METHOD FOR MANUFACTURING THE SAME

(71) Applicant: TAIWAN SEMICONDUCTOR MANUFACTURING COMPANY LTD., Hsinchu (TW)

(72) Inventors: Kuo-Chiang Ting, Hsinchu (TW); Chi-Hsi Wu, Hsinchu (TW); Shang-Yun Hou, Hsinchu (TW); Tu-Hao Yu, Hsin-Chu (TW); Chia-Hao Hsu, Hsinchu County (TW); Pin-Tso Lin, Hsinchu (TW); Chia-Hsin Chen, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/707,301

(22) Filed: Sep. 18, 2017

(65) Prior Publication Data

US 2019/0088582 A1    Mar. 21, 2019

(51) Int. Cl.
| | |
|---|---|
| *H01L 23/498* | (2006.01) |
| *H01L 21/683* | (2006.01) |
| *H01L 23/31* | (2006.01) |
| *H01L 21/56* | (2006.01) |
| *H01L 23/00* | (2006.01) |

(52) U.S. Cl.
CPC .... *H01L 23/49838* (2013.01); *H01L 21/6835* (2013.01); *H01L 23/49816* (2013.01); *H01L 23/49894* (2013.01); *H01L 21/563* (2013.01); *H01L 21/565* (2013.01); *H01L 23/3107* (2013.01); *H01L 23/3171* (2013.01); *H01L 24/09* (2013.01); *H01L 24/13* (2013.01); *H01L 24/17* (2013.01); *H01L 2221/68345* (2013.01); *H01L 2221/68359* (2013.01); *H01L 2224/13082* (2013.01); *H01L 2224/13111* (2013.01); *H01L 2224/13147* (2013.01); *H01L 2224/17505* (2013.01); *H01L 2924/3511* (2013.01)

(58) Field of Classification Search
None
See application file for complete search history.

(56) References Cited

U.S. PATENT DOCUMENTS

| | | | |
|---|---|---|---|
| 8,802,504 | B1 | 8/2014 | Hou et al. |
| 8,803,292 | B2 | 8/2014 | Chen et al. |
| 8,803,316 | B2 | 8/2014 | Lin et al. |
| 8,993,380 | B2 | 3/2015 | Hou et al. |

(Continued)

*Primary Examiner* — Long Pham
(74) *Attorney, Agent, or Firm* — WPAT, P.C., Intellectual Property Attorneys; Anthony King

(57) ABSTRACT

A semiconductor device includes a dielectric interposer, a first interconnection layer, an electronic component, a plurality of electrical conductors and a plurality of conductive structures. The dielectric interposer has a first surface and a second surface opposite to the first surface. The first interconnection layer is over the first surface of the dielectric interposer. The electronic component is over and electrically connected to the first interconnection layer. The electrical conductors are over the second surface of the dielectric interposer. The conductive structures are through the dielectric interposer, wherein the conductive structures are electrically connected to the first interconnection layer and the electrical conductors.

20 Claims, 15 Drawing Sheets

(56) References Cited

U.S. PATENT DOCUMENTS

| | | | |
|---|---|---|---|
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 2016/0372410 A1* | 12/2016 | Kuo | H01L 23/49822 |
| 2018/0308791 A1* | 10/2018 | Zhao | H01L 23/49838 |

* cited by examiner

SEMICONDUCTOR DEVICE AND METHOD FOR MANUFACTURING THE SAME

BACKGROUND

In the packaging of integrated circuits, semiconductor dies may be stacked through bonding, and interconnections between stacked electronic components may be implemented through a silicon interposer. The silicon interposer has high dielectric constant, and thus is suffered from current leakage and RC delay. In addition, reduction of thickness of silicon interposer is restricted due to its material property, and the overall volume of semiconductor device cannot be minimized.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
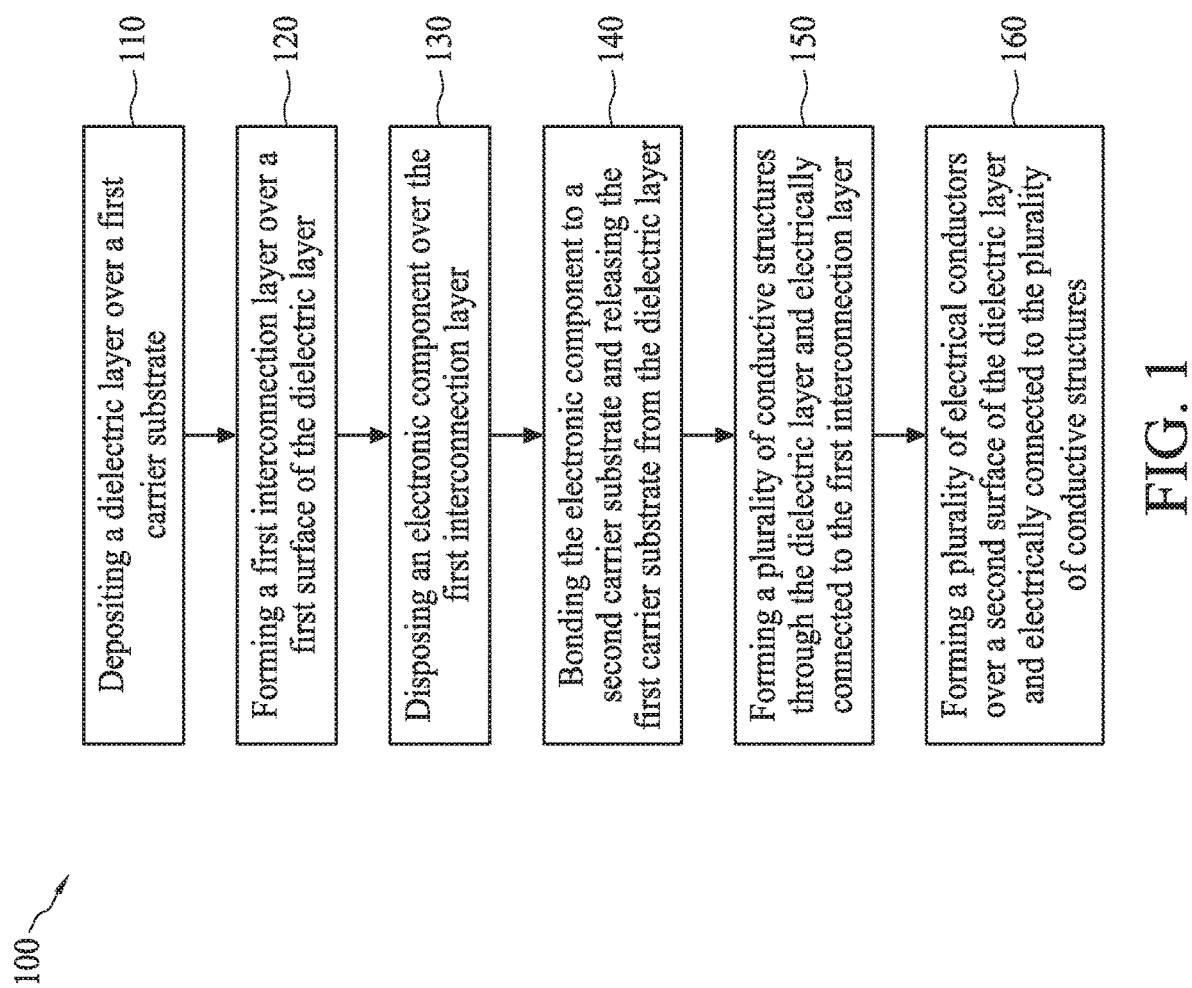
FIG. 1 is a flow chart illustrating a method for manufacturing a semiconductor device according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second," and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In one or more embodiments of the present disclosure, a semiconductor device including a non-semiconductive dielectric interposer is used to interconnect two or more electronic components disposed over two opposite surfaces thereof. The non-semiconductive dielectric interposer has lower dielectric constant, which helps to mitigate current leakage and RC delay. With the lower dielectric constant, the thickness of the non-semiconductive dielectric interposer may be reduced without causing interference between electronic components disposed on two opposite sides of the non-semiconductive dielectric interposer, and thus the overall volume of the semiconductor device may be reduced.

FIG. 1 is a flow chart illustrating a method for manufacturing a semiconductor device according to various aspects of one or more embodiments of the present disclosure. The method 100 begins with operation 110 in which a dielectric layer is deposited over a first carrier substrate. The method 100 proceeds with operation 120 in which a first interconnection layer is formed over a first surface of the dielectric layer. The method 100 proceeds with operation 130 in which an electronic component is disposed over the first interconnection layer. The method 100 continues with operation 140 in which the electronic component is bonded to a second carrier substrate and the first carrier substrate is released from the dielectric layer. The method 100 proceeds with operation 150 in which a plurality of conductive structures through the dielectric layer and electrically connected to the first interconnection layer are formed. The method 100 continues with operation 160 in which a plurality of electrical conductors are formed over a second surface of the dielectric layer and electrically connected to the plurality of conductive structures.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
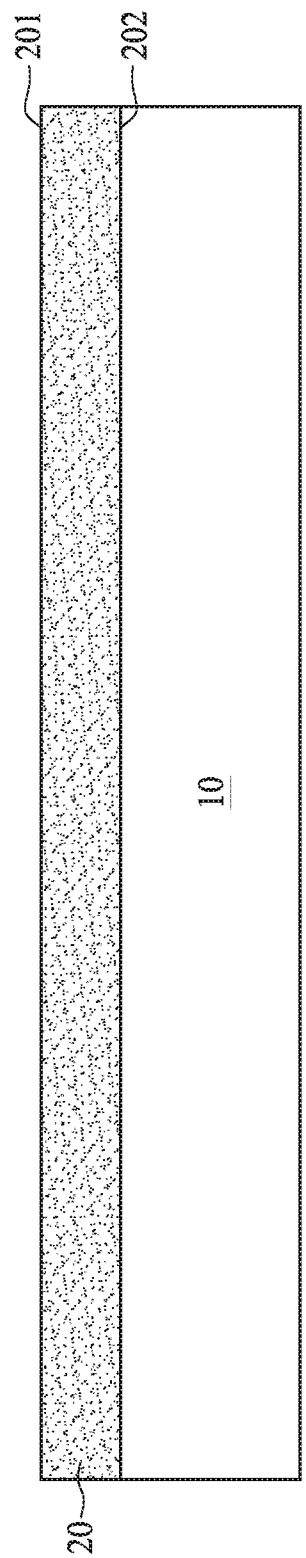
FIG. 2A, FIG. 2B, FIG. 2C, FIG. 2D, FIG. 2E, FIG. 2F and FIG. 2G are schematic views at one of various operations of manufacturing a semiconductor device according to one or more embodiments of the present disclosure.

FIG. 2A, FIG. 2B, FIG. 2C, FIG. 2D, FIG. 2E, FIG. 2F and FIG. 2G are schematic views at one of various operations of manufacturing a semiconductor device according to one or more embodiments of the present disclosure. As depicted in FIG. 2A, a dielectric layer 20 is deposited over a first carrier substrate 10. The first carrier substrate 10 is configured as a temporary carrier substrate for forming the dielectric layer 20 and other structural layer(s), and will be removed subsequently. In some embodiments, the first carrier substrate 10 may include, but is not limited to, a blanket wafer. The dielectric layer 20 includes a first surface 201, and a second surface 202 opposite to the first surface 201. In some embodiments, the dielectric layer 20 is made of a non-semiconductive material. In some embodiments, the dielectric layer 20 is configured as a reinforced layer to enhance robustness of the semiconductor device. In some embodiments, the dielectric layer 20 is configured as a non-semiconductive dielectric interposer, which may replace a semiconductor interposer such as a silicon interposer. In some embodiments, the dielectric constant of the dielectric layer 20 is smaller than that of a semiconductor interposer such as a silicon interposer. In some embodiments, the dielectric constant of the dielectric layer 20 is in a range from about 1 to about 10. By way of examples, the dielectric constant of the dielectric layer 20 is in a range from about 3 to about 8, in a range from about 3 to about 7, in a range from about 3 to about 6, in a range from about 3 to about 5, or in a range from about 3 to about 4. In some embodiments, the modulus of elasticity of the dielectric layer 20 is different from that of a semiconductor interposer such as a silicon interposer. By way of example, the modulus of elasticity of the dielectric layer 20 is larger than that of a semiconductor interposer such as a silicon interposer. In some embodiments, the thickness of the dielectric layer 20 is smaller than that of a semiconductor interposer such as a silicon interposer, which is larger than 50 micrometers. By way of examples, the thickness of the dielectric layer 20 is in a range from about 5 micrometers to about 30 micrometers, in a range from about 10 micrometers to about 25 micrometers, in a range from about 10 micrometers to about 20 micrometers, or in a range from about 10 micrometers to about 15 micrometers. In some embodiments, the dielectric layer 20 may be formed over the first carrier substrate 10, e.g., by chemical vapor deposition (CVD), physical vapor deposition (PVD), spin coating, dispensing or other suitable operations. In some embodiments, the dielectric layer 20 includes an inorganic dielectric material such as silicon oxide, silicon nitride, silicon oxynitride, a combination thereof, or other suitable inorganic dielectric material. In some embodiments, the dielectric layer 20 includes an organic dielectric material such as polyimide, polymethyl methacrylate (PMMA), polybenzoxazole (PBO), a combination thereof, or other suitable organic dielectric material. In some embodiments, the dielectric layer 20 is a single-layered dielectric layer, which may include the above inorganic dielectric material or organic dielectric material.

Figure 2B:
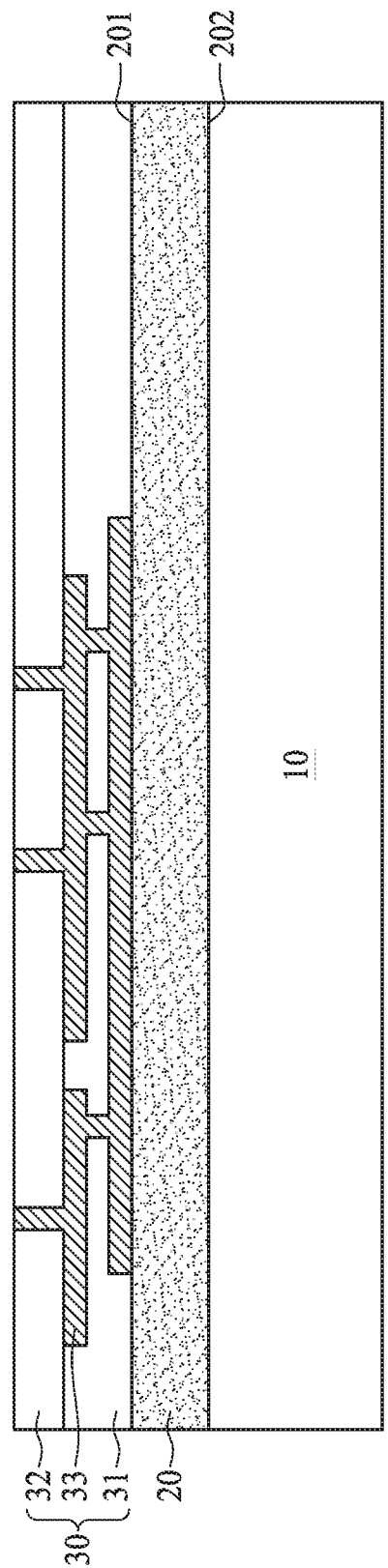

As depicted in FIG. 2B, a first interconnection layer 30 is formed over a first surface 201 of the dielectric layer 20. In some embodiments, the first interconnection layer 30 may include one or more redistribution layers (RDLs), one or more routing layers, or the like. In some embodiments, the first interconnection layer 30 may include insulative layers 31, 32, and conductive layers 33 through the insulative layers 31, 32.

Figure 2C:
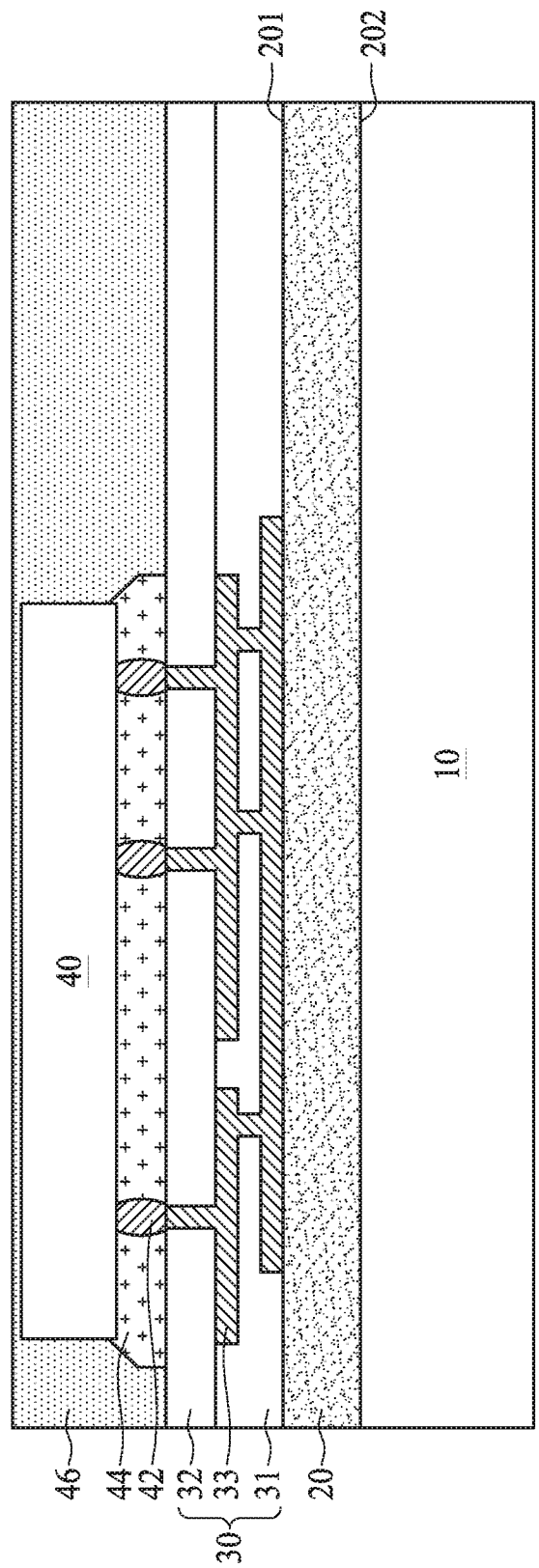

As depicted in FIG. 2C, an electronic component 40 is disposed over and electrically connected to the first interconnection layer 30. In some embodiments, the electronic component 40 may include one or more semiconductor dies, one or more semiconductor packages or other active or passive electronic components. In some embodiments, the electronic component 40 is electrically connected to the first interconnection layer 30 with electrical connectors 42 such as conductive bumps, conductive pastes, conductive balls or the like. In some embodiments, an underfill layer 44 may be interposed between the electronic component 40 and the first interconnection layer 30, and surrounding the electrical connectors 42. In some embodiments, an encapsulant 46 such as a molding compound may be formed over the first interconnection layer 30 to enclose a portion of the electronic component 40. In some embodiments, the encapsulant 46 may enclose a portion of the electronic component 40 such as edges of the electronic component 40. In some embodiments, the encapsulant 46 may further enclose an upper surface of the electronic component 40.

Figure 2D:
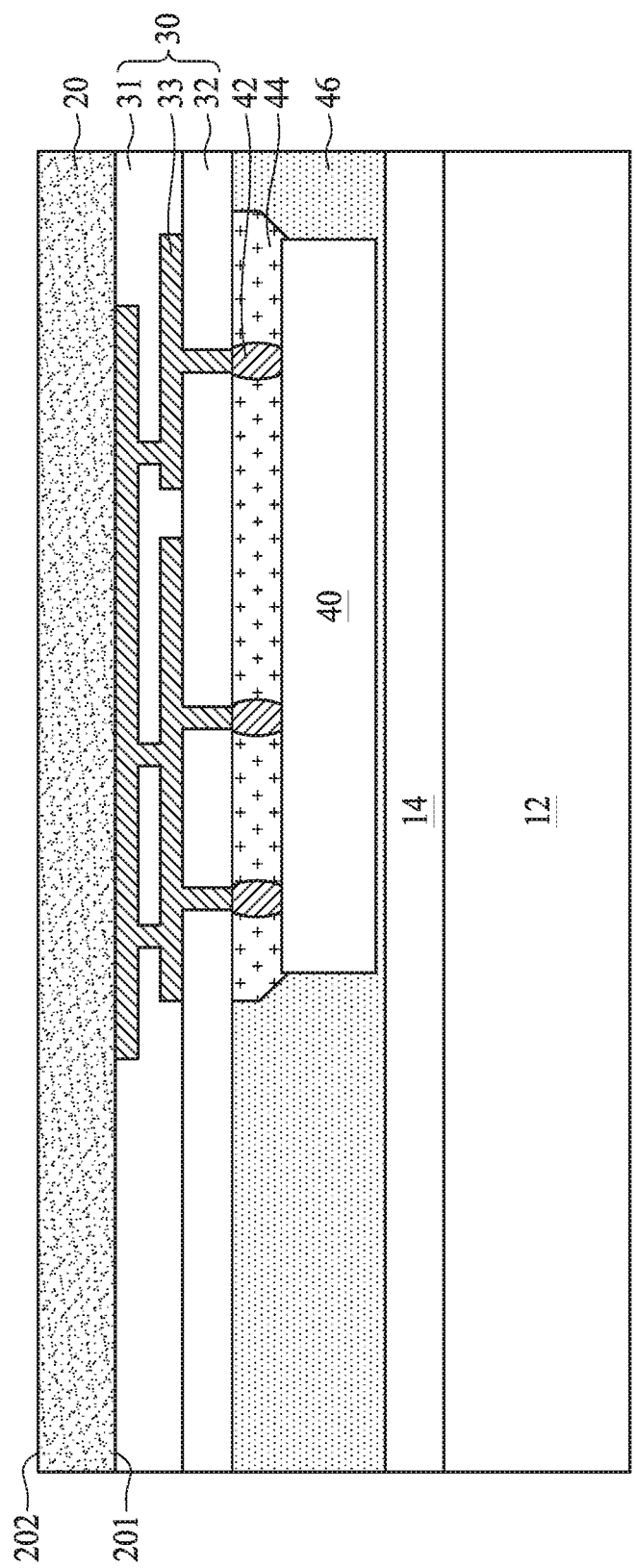

As depicted in FIG. 2D, the electronic component 40 is bonded to a second carrier substrate 12. In some embodiments, the second carrier substrate 12 is configured as a temporary carrier substrate for supporting the dielectric layer 20, the first interconnection layer 30 and the electronic component 40, such that other layers or components may be formed over the second surface 202 of the dielectric layer 20. In some embodiments, the second carrier substrate 12 may include, but is not limited to, a blanket wafer. In some embodiments, the electronic component 40 is bonded to a second carrier substrate 12 with an adhesive layer 14. After the electronic component 40 is bonded to a second carrier substrate 12, the first carrier substrate 10 may be released from the first surface 201 of the dielectric layer 20.

Figure 2E:
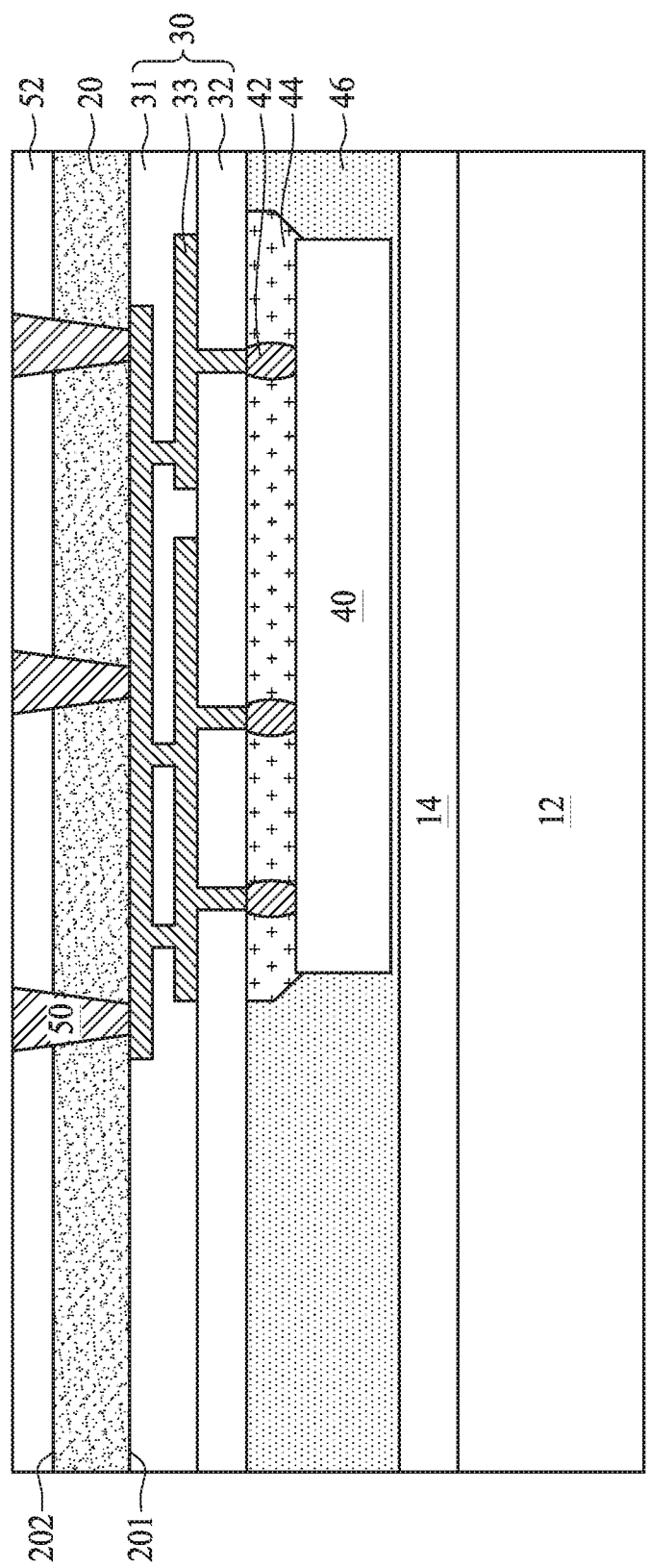

As depicted in FIG. 2E, a plurality of conductive structures 50 through the dielectric layer 20 and electrically connected to the first interconnection layer 30 are formed. In some embodiments, a passivation layer 52 may be formed over the second surface 202 of the dielectric layer 20, and the conductive structures 50 may further penetrate through the passivation layer 52. In some embodiments, the thickness of the conductive structure 50 is substantially equal to that of the dielectric layer 20. In some embodiments, the thickness of the conductive structure is in a range from about 5 micrometers to about 30 micrometers.

Figure 2F:
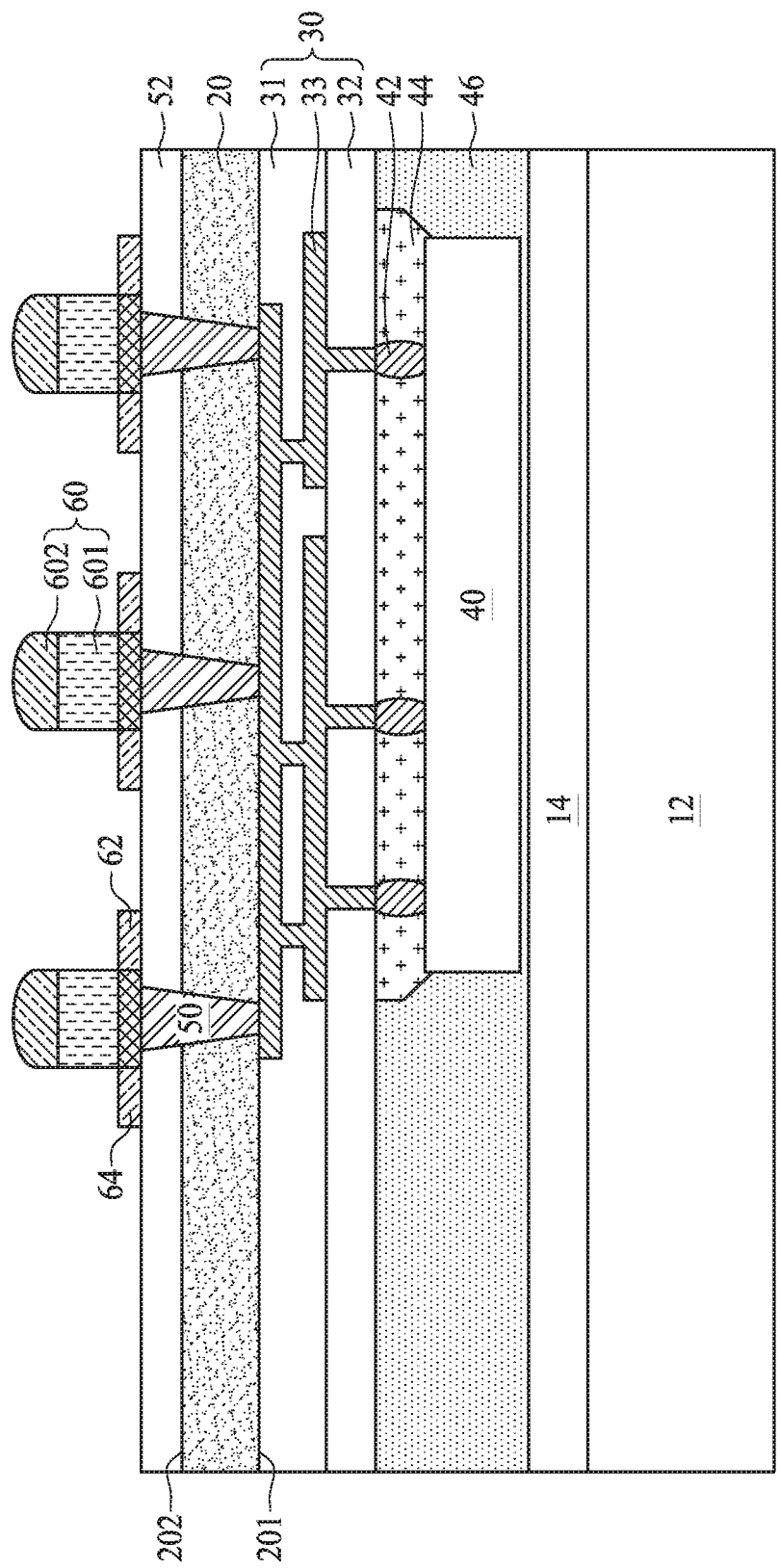

As depicted in FIG. 2F, a plurality of electrical conductors 60 are formed over the second surface 202 of the dielectric layer 20 and electrically connected to the conductive structures 50 respectively. In some embodiments, a plurality of bonding pads 62 may be formed between the electrical conductors 60 and the conductive structures 50, respectively. In some embodiments, the bonding pad 62 may be, but is not limited to be, defined by a mask layer 64 such as a solder mask. In some embodiments, the electrical conductor 60 may include a first conductive material 601 and a second conductive material 602 stacked to each other. By way of examples, the first conductive material 601 may include copper, and the second conductive material 602 may include tin.

Figure 2G:
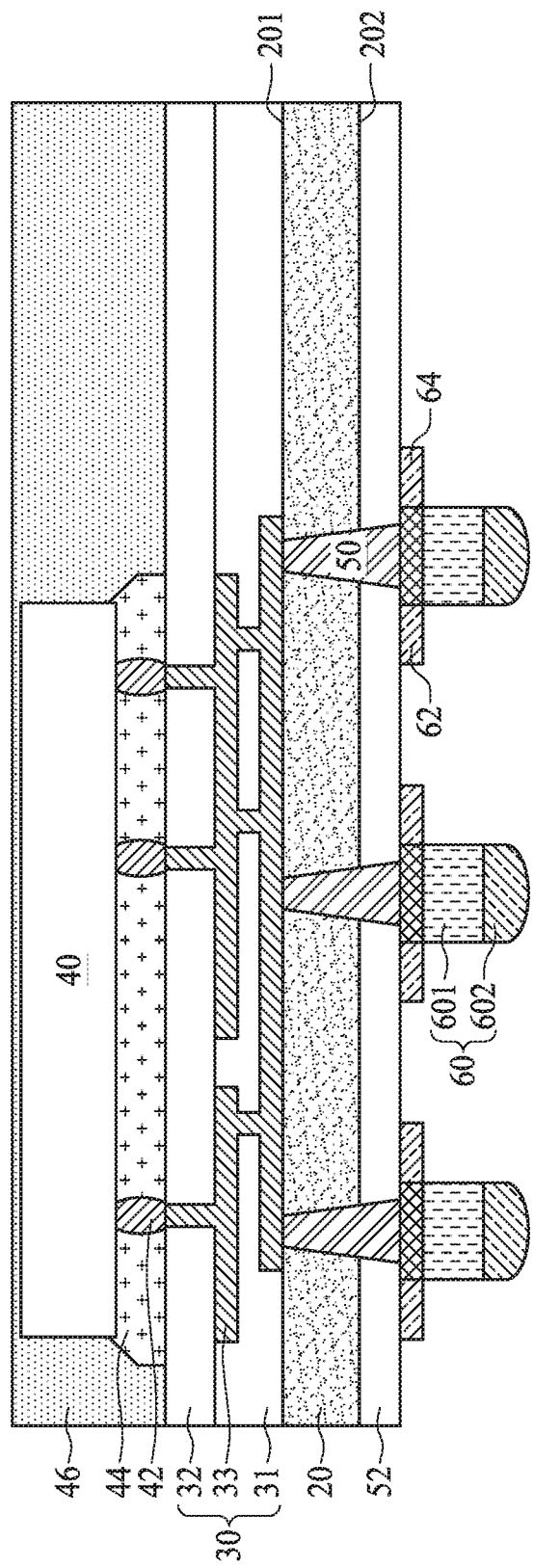

As depicted in FIG. 2G, the second carrier substrate 12 is released from the electronic component 40 to form a semiconductor device 1 of some embodiments of the present disclosure.

In some embodiments of the present disclosure, the semiconductor device 1 uses the dielectric layer 20 as a dielectric interposer to interconnect the electronic component 40 over the first surface 201 and the electrical conductors 60 over the second surface 202. In contrast to a semiconductor interposer, the dielectric interposer may include the following advantages. The dielectric interposer has lower costs. The dielectric interposer is thinner, which shortens interconnection distance to improve electrical performance. The dielectric interposer has lower dielectric constant, which helps to mitigate current leakage and RC delay between electronic components disposed on two opposite surfaces of the interposer. With the lower dielectric constant, the thickness of the dielectric interposer may be reduced without causing interference between electronic components disposed on two opposite surfaces of the interposer, and thus the overall volume of the semiconductor device 1 may be reduced. The dielectric interposer is more flexible than the semiconductor interposer, and thus may help to release stress and reduce delamination risk.

Figure 3:
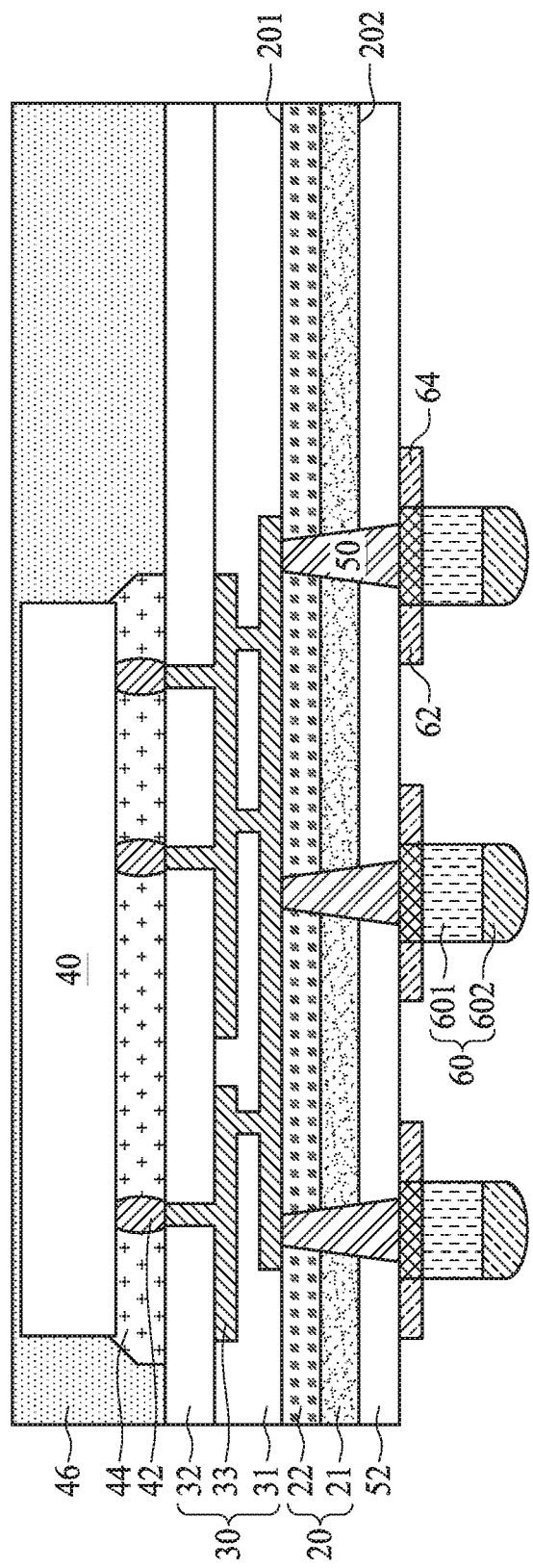
FIG. 3 is a schematic view of a semiconductor device according to one or more embodiments of the present disclosure.

FIG. 3 is a schematic view of a semiconductor device according to one or more embodiments of the present disclosure. As depicted in FIG. 3, in contrast to the semiconductor device 1 of FIG. 2G, the dielectric layer 20 of the semiconductor device 1' may include a multi-layered dielectric layer, which may include two or more dielectric films 21 and 22 stacked on each other. Each of the films 21 and 22 of the multi-layered dielectric layer may individually include an inorganic dielectric material or an organic dielectric material. By way of examples, the dielectric film 21 may include an inorganic dielectric material such as silicon oxide, silicon nitride, silicon oxynitride, a combination thereof, or other suitable inorganic dielectric material. The other dielectric film 22 may include an organic dielectric material such as polyimide, polymethyl methacrylate (PMMA), polybenzoxazole (PBO), a combination thereof, or other suitable organic dielectric material. In some embodiments, the dielectric film 21 may include an organic dielectric material, while the dielectric film 22 may include an inorganic dielectric material. In some embodiments, the dielectric constant of the multi-layered dielectric layer 20 is smaller than that of a semiconductor interposer such as a silicon interposer. In some embodiments, the dielectric constant of the dielectric layer 20 is in a range from about 1 to about 10. By way of examples, the dielectric constant of the multi-layered dielectric layer 20 is in a range from about 3 to about 8, in a range from about 3 to about 7, in a range from about 3 to about 6, in a range from about 3 to about 5, or in a range from about 3 to about 4. In some embodiments, the modulus of elasticity of the multi-layered dielectric layer 20 is different from that of a semiconductor interposer such as a silicon interposer. By way of example, the modulus of elasticity of the dielectric layer 20 is larger than that of a semiconductor interposer such as a silicon interposer. In some embodiments, the thickness of the multi-layered dielectric layer 20 is smaller than that of a semiconductor interposer such as a silicon interposer, which is larger than 50 micrometers. By way of examples, the thickness of the dielectric layer 20 is in a range from about 5 micrometers to about 30 micrometers, in a range from about 10 micrometers to about 25 micrometers, in a range from about 10 micrometers to about 20 micrometers, or in a range from about 10 micrometers to about 15 micrometers.

In some embodiments of the present disclosure, the semiconductor device 1' uses the multi-layered dielectric layer 20 as a dielectric interposer to interconnect the electronic component 40 over the first surface 201 and the electrical conductors 60 over the second surface 202. In contrast to a semiconductor interposer, the dielectric interposer may include the following advantages. The dielectric interposer has lower costs. The dielectric interposer is thinner, which shortens interconnection distance to improve electrical performance. The dielectric interposer has lower dielectric constant, which helps to mitigate current leakage and RC delay between electronic components disposed on two opposite surfaces of the interposer. With the lower dielectric constant, the thickness of the dielectric interposer may be reduced without causing interference between electronic components disposed on two opposite surfaces of the interposer, and thus the overall volume of the semiconductor device 1' may be reduced. The dielectric interposer is more flexible than the semiconductor interposer, and thus may help to release stress and reduce delamination risk. The multi-layered dielectric layer 20 may further be configured to compensate mismatch between adjacent structural layers such as CTE mismatch or stress mismatch, and thus warpage issue may be alleviated.

The semiconductor device and its manufacturing method of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 4:
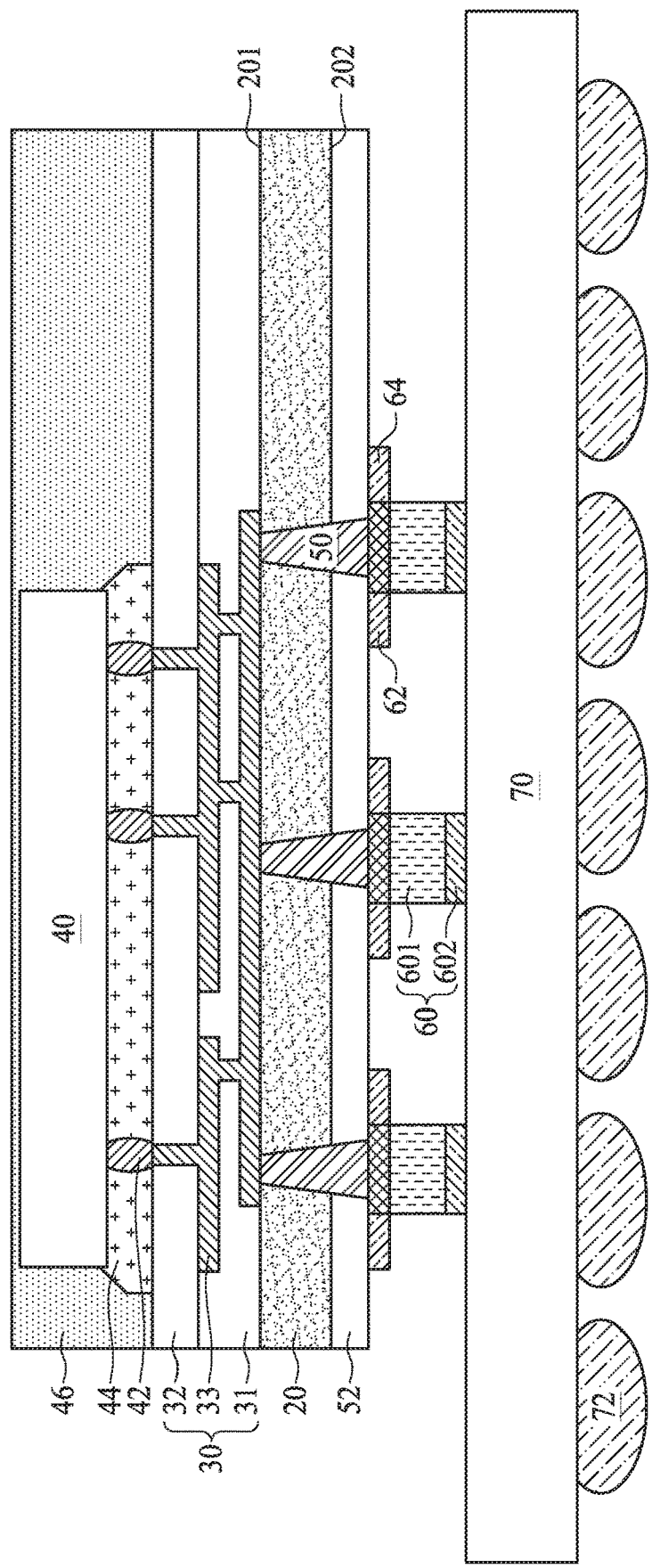
FIG. 4 is a schematic view of a semiconductor device according to one or more embodiments of the present disclosure.

FIG. 4 is a schematic view of a semiconductor device according to one or more embodiments of the present disclosure. As depicted in FIG. 4, in contrast to the semiconductor device 1 of FIG. 2G, the semiconductor device 2 may include a chip-on-wafer-on-substrate (COWOS) package structure, which may further include a package substrate 70 over and electrically connected to the electrical conductors 60. In some embodiments, electrical circuits may be formed in the package substrate 70. In some embodiments, the semiconductor device 2 may further include a plurality of second electrical conductors 72 over and electrically connected to the package substrate 70, and opposite to the electrical conductors 60. The second electrical conductors 72 may be electrically connected to the electronic component 40 through the package substrate 70, the electrical conductors 60, the conductive structures 50 and the first interconnection layer 30. In some embodiments, the second electrical conductors 72 are configured to electrically connect the electronic component 40 to another electronic component such as a printed circuit board (PCB). In some embodiments, the second electrical conductors 72 may include, but are not limited to be, conductive bumps, conductive pastes, conductive balls or the like. In some embodiments, the dielectric layer 20 may be a single-layered dielectric layer as described in FIGS. 2A to 2G. In some embodiments, the dielectric layer 20 may be a multi-layered dielectric layer as described in FIG. 3.

In some embodiments of the present disclosure, the semiconductor device 2 uses the dielectric layer 20 as a dielectric interposer to interconnect the electronic component 40 over the first surface 201 and the electrical conductors 60 over the second surface 202. In contrast to a semiconductor interposer, the dielectric interposer may include the following advantages. The dielectric interposer has lower costs. The dielectric interposer is thinner, which shortens interconnection distance to improve electrical performance. The dielectric interposer has lower dielectric constant, which helps to mitigate current leakage and RC delay between electronic components disposed on two opposite surfaces of the interposer. With the lower dielectric constant, the thickness of the dielectric interposer may be reduced without causing interference between electronic components disposed on two opposite surfaces of the interposer, and thus the overall volume of the semiconductor device 2 may be reduced. The dielectric interposer is more flexible than the semiconductor interposer, and thus may help to release stress and reduce delamination risk.

Figure 5:
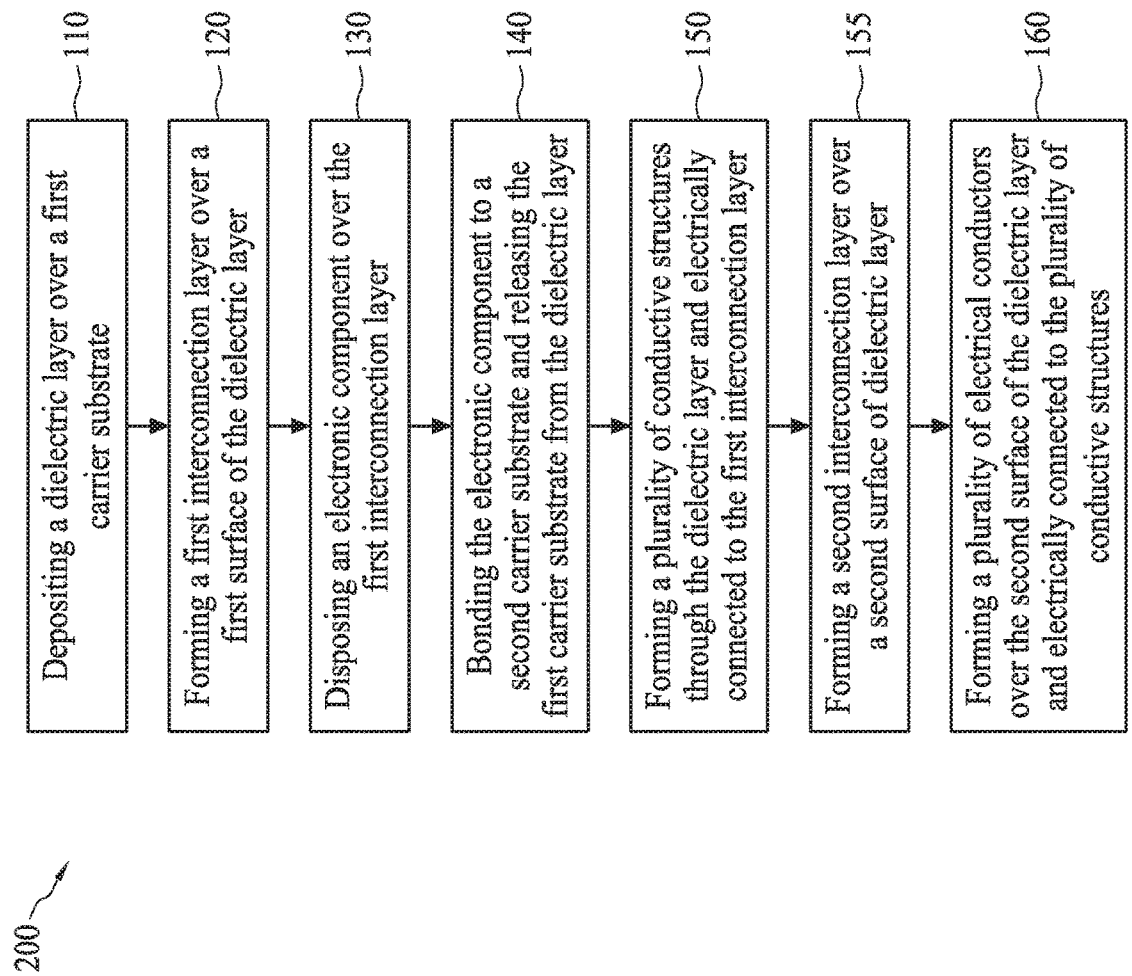
FIG. 5 is a flow chart illustrating a method for manufacturing a semiconductor device according to various aspects of one or more embodiments of the present disclosure.

FIG. 5 is a flow chart illustrating a method for manufacturing a semiconductor device according to various aspects of one or more embodiments of the present disclosure. The method 200 begins with operation 110 in which a dielectric layer is deposited over a first carrier substrate. The method proceeds with operation 120 in which a first interconnection layer is formed over a first surface of the dielectric layer. The method proceeds with operation 130 in which an electronic component is disposed over the first interconnection layer. The method continues with operation 140 in which the electronic component is bonded to a second carrier substrate and the first carrier substrate is released from the dielectric layer. The method proceeds with operation 150 in which a plurality of conductive structures through the dielectric layer and electrically connected to the first interconnection layer are formed. The method continues with operation 155 in which a second interconnection layer is formed over a second surface of dielectric layer. The method continues with operation 160 in which a plurality of electrical conductors are formed over the second surface of the dielectric layer and electrically connected to the plurality of conductive structures.

The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method.

Figure 6A:
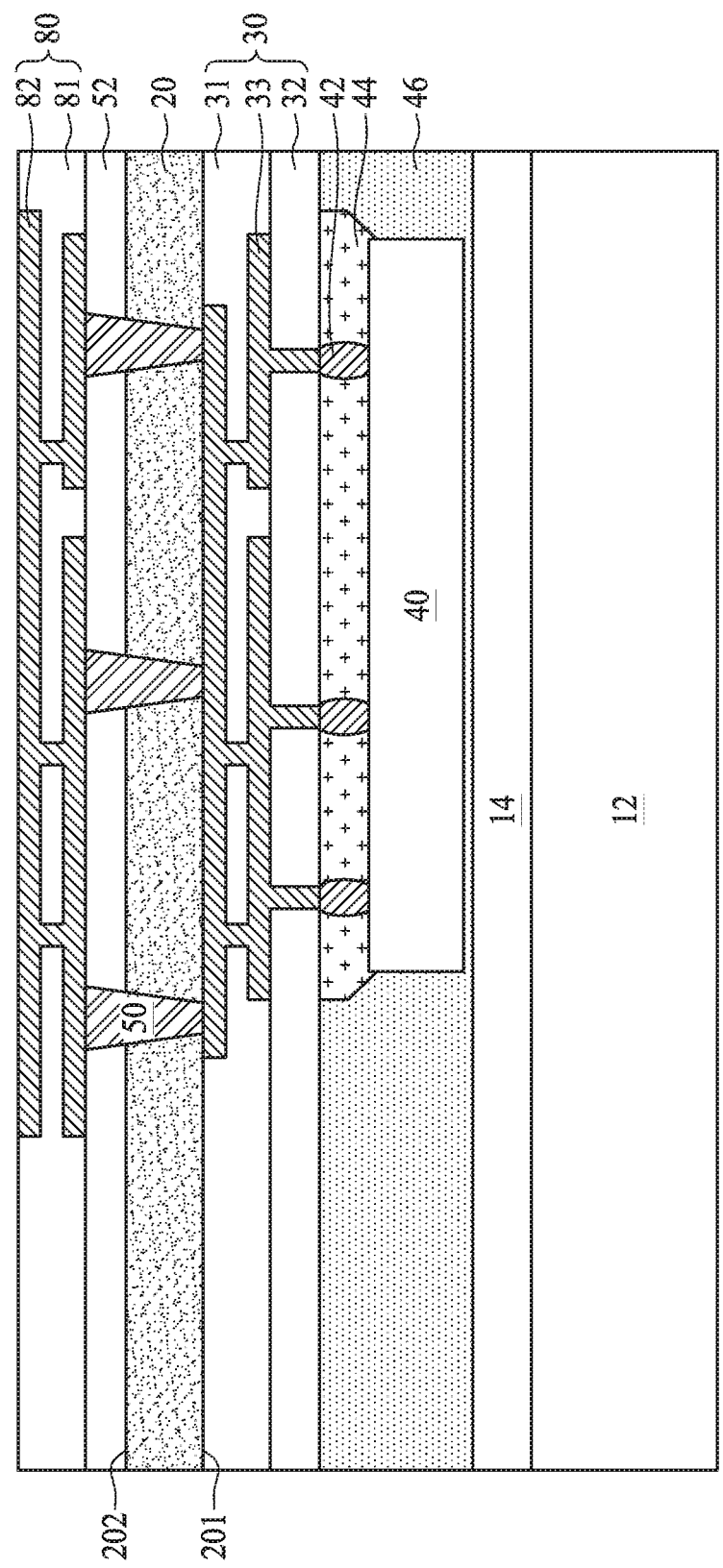
FIG. 6A, FIG. 6B and FIG. 6C are schematic views at one of various operations of manufacturing a semiconductor device according to one or more embodiments of the present disclosure.
Figure 6B:
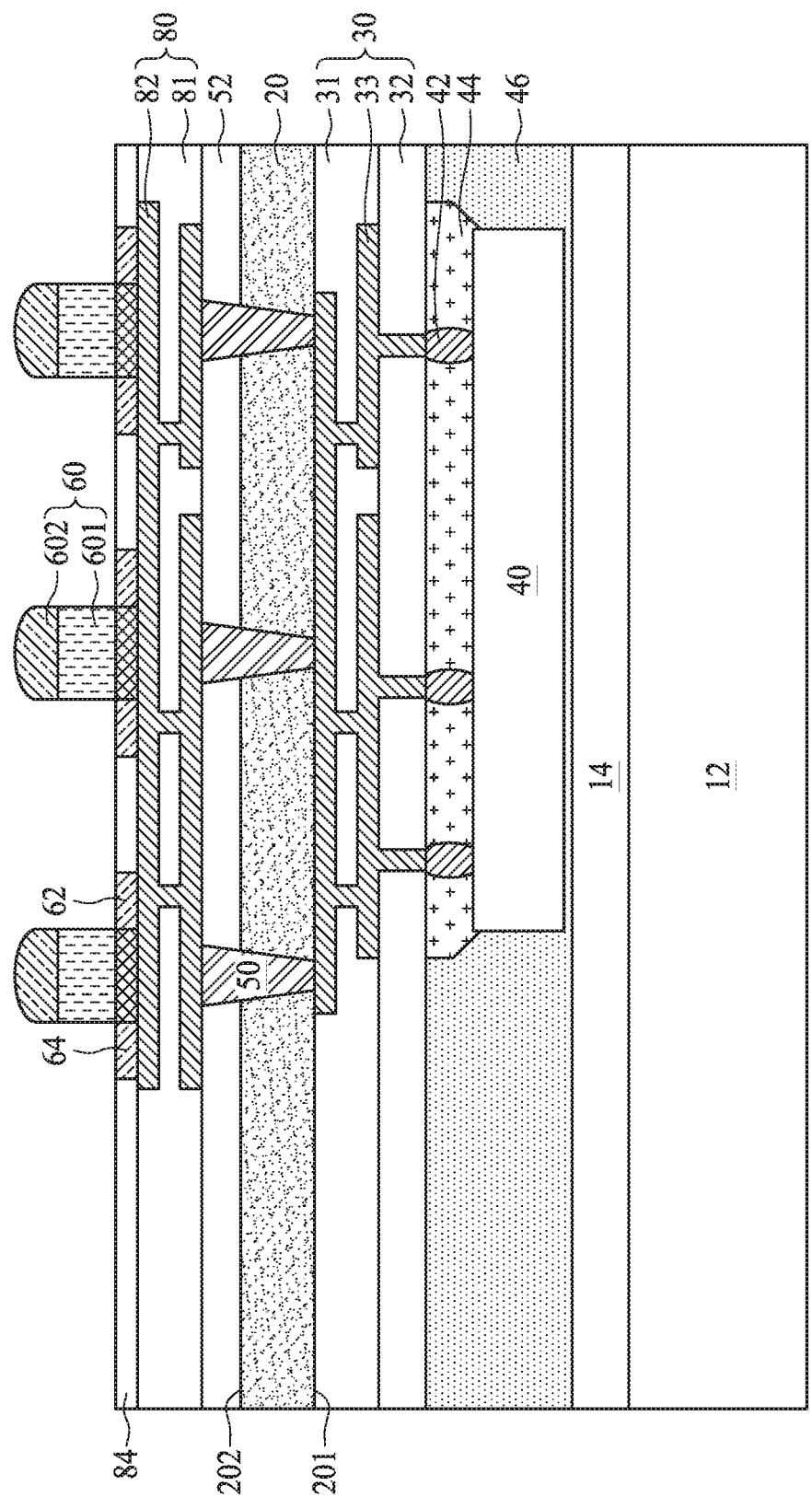
Figure 6C:
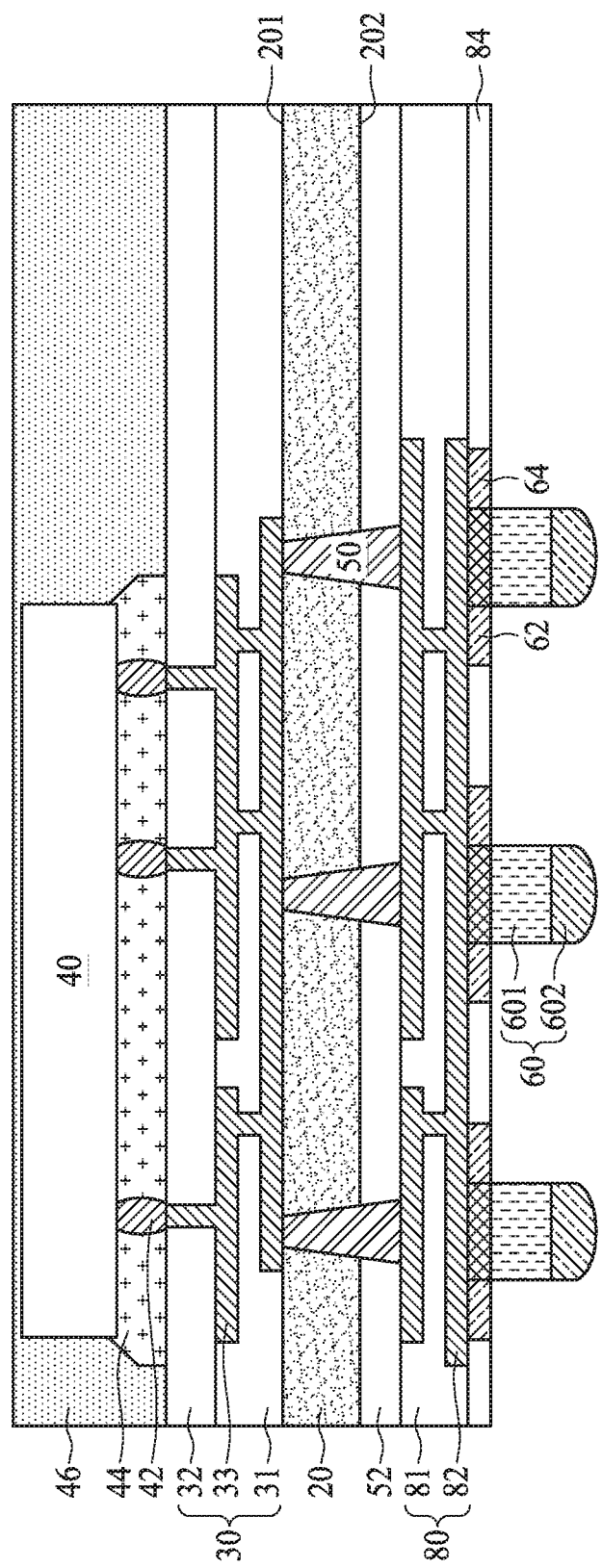

FIG. 6A, FIG. 6B and FIG. 6C are schematic views at one of various operations of manufacturing a semiconductor device according to one or more embodiments of the present disclosure. In some embodiments, the manufacturing of a semiconductor device of FIG. 6A, FIG. 6B and FIG. 6C may be implemented followed by FIG. 2E. As depicted in FIG. 6A, a second interconnection layer 80 is formed over the second surface 202 of dielectric layer 20 and electrically connected to the conductive structures 50. The second interconnection layer 80 is formed prior to formation of the electrical conductors 60. In some embodiments, the second interconnection layer 80 may include one or more redistribution layers (RDLs), one or more routing layers, or the like. In some embodiments, the second interconnection layer 80 may include one or more insulative layers 81, and one or more conductive layers 82 through the insulative layer 81.

As depicted in FIG. 6B, another passivation layer 84 may be formed over the second interconnection layer 80 in some embodiments. In some embodiments, the passivation layer 84 exposes a portion of the second interconnection layer 80. A plurality of electrical conductors 60 are formed over the second interconnection layer 80 and electrically connected to the conductive structures 50 through the second interconnection layer 80. In some embodiments, a plurality of bonding pads 62 may be formed between the electrical conductors 60 and the second interconnection layer 80. In some embodiments, the bonding pad 62 may be, but is not limited to be, defined by a mask layer 64 such as a solder mask. In some embodiments, the electrical conductor 60 may include a first conductive material 601 and a second conductive material 602 stacked to each other. By way of examples, the first conductive material 601 may include copper, and the second conductive material 602 may include tin.

As depicted in FIG. 6C, the second carrier substrate 12 is released from the electronic component 40 to form a semiconductor device 3 of some embodiments of the present disclosure.

In some embodiments of the present disclosure, the semiconductor device 3 uses the dielectric layer 20 as a dielectric interposer to interconnect the electronic component 40 over the first surface 201 and the electrical conductors 60 over the second surface 202. In contrast to a semiconductor interposer, the dielectric interposer may include the following advantages. The dielectric interposer has lower costs. The dielectric interposer is thinner, which shortens interconnection distance to improve electrical performance. The dielectric interposer has lower dielectric constant, which helps to mitigate current leakage and RC delay between electronic components disposed on two opposite surfaces of the interposer. With the lower dielectric constant, the thickness of the dielectric interposer may be reduced without causing interference between electronic components disposed on two opposite surfaces of the interposer, and thus the overall volume of the semiconductor device 3 may be reduced. The dielectric interposer is more flexible than the semiconductor interposer, and thus may help to release stress and reduce delamination risk. In some embodiments, the second interconnection layer 80 may be configured to redistribute circuit layout. In some embodiments, the dielectric layer 20 may be a single-layered dielectric layer as described in FIGS. 2A to 2G. In some embodiments, the dielectric layer 20 may be a multi-layered dielectric layer as described in FIG. 3.

Figure 7:
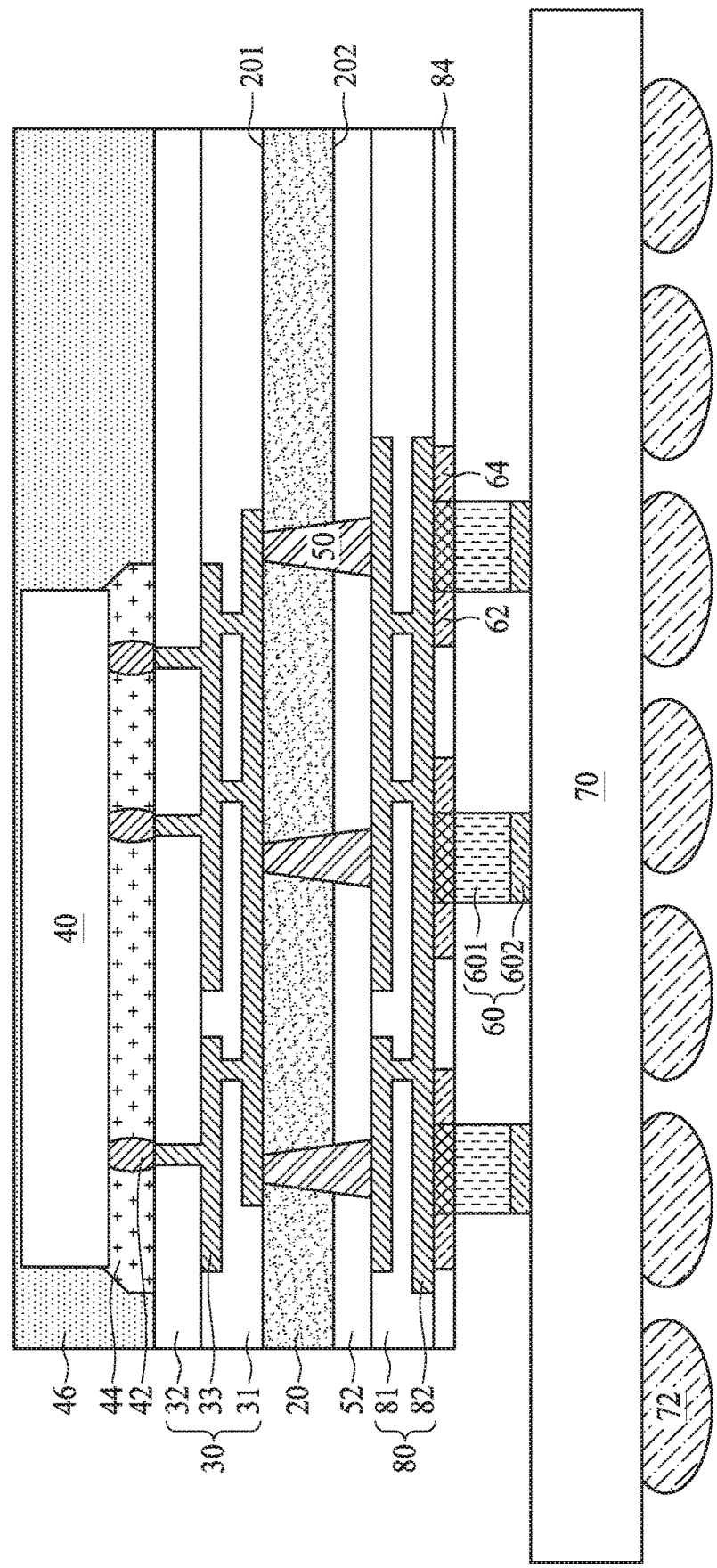
FIG. 7 is a schematic view of a semiconductor device according to one or more embodiments of the present disclosure.

FIG. 7 is a schematic view of a semiconductor device according to one or more embodiments of the present disclosure. As depicted in FIG. 7, in contrast to the semiconductor device 3 of FIG. 6C, the semiconductor device 4 may include a chip-on-wafer-on-substrate (COWOS) package structure, which may further include a package substrate 70 over and electrically connected to the electrical conductors 60. In some embodiments, electrical circuits may be formed in the package substrate 70. In some embodiments, the semiconductor device 4 may further include a plurality of second electrical conductors 72 over and electrically connected to the package substrate 70, and opposite to the electrical conductors 60. The second electrical conductors 72 may be electrically connected to the electronic component 40 through the package substrate 70, the electrical conductors 60, the conductive structures 50 and the first interconnection layer 30. In some embodiments, the second electrical conductors 72 are configured to electrically connect the electronic component 40 to another electronic component such as a printed circuit board (PCB). In some embodiments, the second electrical conductors 72 may include may include, but are not limited to be, conductive bumps, conductive pastes, conductive balls or the like. In some embodiments, the dielectric layer 20 may be a single-layered dielectric layer as described in FIGS. 2A to 2G. In some embodiments, the dielectric layer 20 may be a multi-layered dielectric layer as described in FIG. 3.

In some embodiments of the present disclosure, the semiconductor device 4 uses the dielectric layer 20 as a dielectric interposer to interconnect the electronic component 40 over the first surface 201 and the electrical conductors 60 over the second surface 202. In contrast to a semiconductor interposer, the dielectric interposer may include the following advantages. The dielectric interposer has lower costs. The dielectric interposer is thinner, which shortens interconnection distance to improve electrical performance. The dielectric interposer has lower dielectric constant, which helps to mitigate current leakage and RC delay between electronic components disposed on two opposite surfaces of the interposer. With the lower dielectric constant, the thickness of the dielectric interposer may be reduced without causing interference between electronic components disposed on two opposite surfaces of the interposer, and thus the overall volume of the semiconductor device 4 may be reduced. The dielectric interposer is more flexible than the semiconductor interposer, and thus may help to release stress and reduce delamination risk. In some embodiments, the second interconnection layer 80 may be configured to redistribute circuit layout, and release stress from the second electrical conductors 72.

In some embodiments of the present disclosure, a non-semiconductive dielectric interposer is used to interconnect two or more electronic components disposed over two opposite surfaces thereof. In contrast to a semiconductor interposer, the non-semiconductive dielectric interposer has lower dielectric constant, which helps to mitigate current leakage and RC delay. With the lower dielectric constant, the thickness of the non-semiconductive dielectric interposer may be reduced without causing interference between electronic components disposed on two opposite sides of the non-semiconductive dielectric interposer, and thus the overall volume of the semiconductor device may be reduced. In some embodiments of the present disclosure, the non-semiconductive dielectric interposer is more flexible than a semiconductor interposer, and thus may help to reduce delamination risk. In some embodiments of the present disclosure, The non-semiconductive dielectric interposer may be multi-layered, which may be configured to compensate mismatch between adjacent structural layers such as CTE mismatch or stress mismatch, and thus warpage issue may be alleviated.

In one exemplary aspect, a semiconductor device includes a dielectric interposer, a first interconnection layer, an electronic component, a plurality of electrical conductors and a plurality of conductive structures. The dielectric interposer has a first surface and a second surface opposite to the first surface. The first interconnection layer is over the first surface of the dielectric interposer. The electronic component is over and electrically connected to the first interconnection layer. The electrical conductors are over the second surface of the dielectric interposer. The conductive structures are through the dielectric interposer, wherein the conductive structures are electrically connected to the first interconnection layer and the electrical conductors.

In another aspect, a semiconductor device includes a non-semiconductive dielectric interposer, a first interconnection layer, an electronic component, a plurality of electrical conductors, a plurality of conductive structures and a package substrate. The non-semiconductive dielectric interposer has a first surface and a second surface opposite to the first surface. The first interconnection layer is over the first surface of the non-semiconductive dielectric interposer. The electronic component is over and electrically connected to the first interconnection layer. The electrical conductors are over the second surface of the non-semiconductive dielectric interposer. The conductive structures are through the non-semiconductive dielectric interposer, and electrically connected to the first interconnection layer and the electrical conductors. The package substrate is over and electrically connected to the plurality of electrical conductors.

In yet another aspect, a method for manufacturing a semiconductor device includes: depositing a dielectric layer over a first carrier substrate; forming a first interconnection layer over a first surface of the dielectric layer; disposing an electronic component over the first interconnection layer; bonding the electronic component to a second carrier substrate and releasing the first carrier substrate from the dielectric layer; forming a plurality of conductive structures through the dielectric layer and electrically connected to the first interconnection layer; and forming a plurality of electrical conductors over a second surface of the dielectric layer and electrically connected to the plurality of conductive structures.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a dielectric interposer having a first surface and a second surface opposite to the first surface;
 a first interconnection layer over the first surface of the dielectric interposer, wherein the first interconnection layer comprises a redistribution layer (RDL);
 an electronic component over and electrically connected to the first interconnection layer;

a plurality of electrical connectors between and electrically connected to the RDL and the electronic component;

a plurality of electrical conductors over the second surface of the dielectric interposer; and a plurality of conductive structures through the dielectric interposer, wherein the conductive structures are electrically connected to the first interconnection layer and the electrical conductors, and a width of the conductive structure proximal to the first surface is narrower than a width of the conductive structure proximal to the second surface.

2. The semiconductor device of claim 1, wherein each of the conductive structures includes a trapezoid cross-sectional shape.

3. The semiconductor device of claim 1, wherein a thickness of the dielectric interposer is in a range from about 5 micrometers to about 30 micrometers.

4. The semiconductor device of claim 1, wherein the dielectric interposer comprises an inorganic dielectric material.

5. The semiconductor device of claim 4, wherein the inorganic dielectric material comprises silicon oxide, silicon nitride, silicon oxynitride or a combination thereof.

6. The semiconductor device of claim 1, wherein the dielectric interposer comprises an organic dielectric material.

7. The semiconductor device of claim 6, wherein the organic dielectric material comprises polyimide, polymethyl methacrylate (PMMA), polybenzoxazole (PBO) or a combination thereof.

8. The semiconductor device of claim 1, wherein the dielectric interposer is a multi-layered interposer.

9. The semiconductor device of claim 1, further comprising a second interconnection layer over the second surface of the dielectric interposer, wherein the electrical conductors are electrically connected to the conductive structures through the second interconnection layer.

10. A semiconductor device, comprising:
   a dielectric layer having a first surface and a second surface opposite to the first surface, wherein the dielectric layer comprises a plurality of dielectric films staked on one another, and a dielectric constant of the dielectric layer is in a range from about 1 to about 10;
   a first interconnection layer over the first surface of the dielectric layer, wherein the first interconnection layer comprises a redistribution layer (RDL);
   an electronic component over the first interconnection layer;
   a plurality of electrical connectors between and electrically connected to the RDL and the electronic component;
   a plurality of electrical conductors over the second surface of the dielectric layer; and
   a plurality of conductive structures through the dielectric films of the dielectric layer, and electrically connected to the first interconnection layer and the electrical conductors.

11. The semiconductor device of claim 10, wherein a thickness of the dielectric layer is in a range from about 5 micrometers to about 30 micrometers.

12. The semiconductor device of claim 10, wherein each of the dielectric films individually includes an inorganic material or an organic material.

13. The semiconductor device of claim 10, further comprising a second interconnection layer over the second surface of the dielectric layer, wherein the electrical conductors are electrically connected to the conductive structures through the second interconnection layer.

14. A semiconductor device, comprising:
   a dielectric interposer having a first surface and a second surface opposite to the first surface;
   a first redistribution layer (RDL) over the first surface of the dielectric interposer;
   an electronic component over and electrically connected to the first RDL;
   a plurality of electrical connectors between and electrically connected to the first RDL and the electronic component;
   a second RDL over the second surface of the dielectric interposer;
   a plurality of electrical conductors over and electrically connected to the second RDL; and
   a plurality of conductive structures through the dielectric interposer, wherein the conductive structures are electrically connected to the first RDL and the second RDL, and a width of the conductive structure proximal to the first surface is narrower than a width of the conductive structure proximal to the second surface.

15. The semiconductor device of claim 14, further comprising an encapsulant over the first RDL and enclosing the electronic component.

16. The semiconductor device of claim 15, wherein the first RDL comprises one or more insulative layers, and one or more conductive layers through the one or more insulative layers.

17. The semiconductor device of claim 16, wherein edges of the one or more conductive layers of the first RDL are separated from the encapsulant.

18. The semiconductor device of claim 14, further comprising an underfill layer between the electronic component and the first RDL and surrounding the electrical connectors.

19. The semiconductor device of claim 14, wherein the second RDL comprises one or more insulative layers, and one or more conductive layers through the one or more insulative layers.

20. The semiconductor device of claim 14, further comprising a package substrate over and electrically connected to the plurality of electrical conductors.

* * * * *